United States Patent [19]

Tanigawa

[11] Patent Number: 5,305,256
[45] Date of Patent: Apr. 19, 1994

[54] SEMICONDUCTOR MEMORY DEVICE HAVING STACKED CAPACITOR CELL

[75] Inventor: Takaho Tanigawa, Tokyo, Japan

[73] Assignee: NEC Corporation, Tokyo, Japan

[21] Appl. No.: 885,825

[22] Filed: May 20, 1992

[30] Foreign Application Priority Data

May 21, 1991 [JP] Japan .................... 3-115158

[51] Int. Cl.$^5$ ............................ H01G 4/06
[52] U.S. Cl. .................... 365/149; 257/306; 257/296
[58] Field of Search ........... 365/149; 257/306, 307, 257/308, 309, 310, 296

[56] References Cited

U.S. PATENT DOCUMENTS

| | | | |
|---|---|---|---|
| 4,951,175 | 8/1990 | Kurosawa et al. | 257/306 |
| 5,005,072 | 4/1991 | Gonzalez | 257/306 |
| 5,173,752 | 12/1992 | Motonami et al. | 257/309 |

FOREIGN PATENT DOCUMENTS

3-49259  3/1991  Japan .................... 365/306

*Primary Examiner*—Eugene R. LaRoche
*Assistant Examiner*—Vu A. Le
*Attorney, Agent, or Firm*—Sughrue, Mion, Zinn, Macpeak & Seas

[57] ABSTRACT

A semiconductor memory device having a cell structure capable of maintaining a capacitance of a stacked capacitor at a satisfactory level, which is characterized in that in the first aspect, an insulation layer of an oxide film is formed on an upper surface of a polysilicon gate electrode and a side-wall of an oxide film is formed on the side surface thereof, and in the second aspect, after opening a storage electrode contact, another side-wall of an oxide film Is formed thereon. Accordingly, the space between the storage electrode contact and the polysilicon gate electrode can be made zero (0), that is, in a self-alignment form, resulting in a reduction in the necessary planar surface area of a memory cell to about 5 $\mu m^2$ or less.

4 Claims, 7 Drawing Sheets

SEMICONDUCTOR MEMORY DEVICE HAVING STACKED CAPACITOR CELL

BACKGROUND OF THE INVENTION (1) Field of the Invention

The present invention relates to a semiconductor memory device having, in a cell structure capable of satisfactorily maintaining the capacity, a stacked capacitor with a memory cell whose planar surface area can be made small.

(2) Description of the Related Art

A conventional stacked dynamic random access memory (DRAM) of the kind to which the present invention relates will first be described below with reference to FIG. 1.

Figure 1:
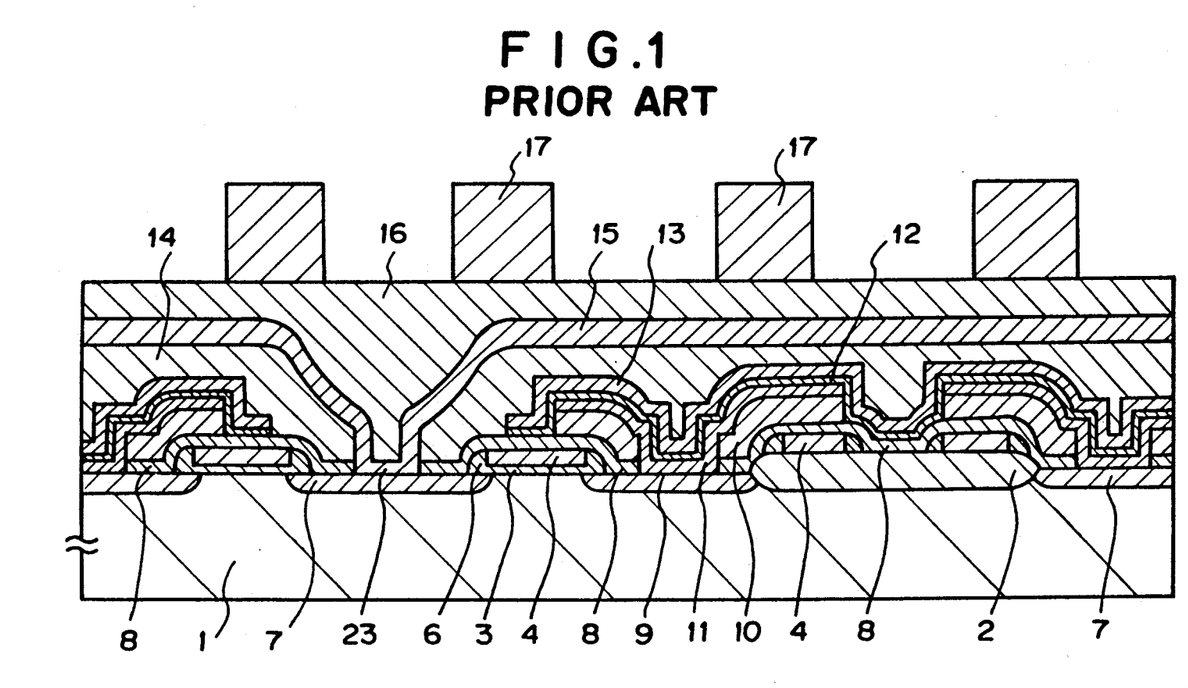
FIG. 1 is a cross-sectional view of a typical example of a conventional semiconductor memory device.

In FIG. 1, the conventional stacked DRAM includes a semiconductor substrate 1; a field oxide film 2; a gate oxide film 3; a gate electrode 4 made of polysilicon; a side-wall 6 which is provided to the gate electrode 4 and which is made of an oxide film; an impurity diffusion layer 7; interlayer insulation layers 8, 14 and 16; a storage electrode contact 9; a first electroconductive film 10 which constitutes one part of a capacity storage electrode; a second electroconductive film 11 which constitutes another part of the capacity storage electrode; a capacity insulation film 12; a capacity opposed electrode 13; a bit line 15 which is made of a high melting-point metal silicide, and contacts impurity diffusion layer 7 to form a bit line contact 23 and an aluminum wiring 17.

An advantage in such a conventional semiconductor memory device as explained above is that, even where a planar surface area of the cell is made in the order of, for example, 10 $\mu m^2$ or less, the surface area of the first electroconductive film 10 constituting one part of the capacity storage electrode can be made sufficiently large, thereby allowing a sufficient capacitance to be maintained, so that the holding time of charge for information is made long and the resistance to soft-error due to radiations of such as alpha-ray is made higher.

However, a recent trend in this field is to make semiconductor memory devices further miniaturized in structure. With the progress of this trend, there is a strong demand for a planar surface area of a memory cell to be further reduced. If it is reduced, for example, to about 5 $\mu m^2$ or less, it becomes difficult to form the storage electrode contact 9 with a sufficient space (for example, about 0.3 $\mu m$ or more) being provided from the gate electrode 4 to maintain the electrical insulation between the capacity storage electrode 11 and the gate electrode 4. On the other hand, if the above-mentioned space is made as small as, for example, about 0.2 $\mu m$ or less in the prior art arrangement, there will be a problem in that the electrical insulation between the gate electrode 4 and the capacity storage electrode 11 can no longer be maintained. This is a problem to be solved by the invention in the conventional semiconductor memory device.

SUMMARY OF THE INVENTION

The present invention aims at solving the above-mentioned problem, and an object of the invention is to provide an improved semiconductor memory device which has a stacked cell structure capable of maintaining a capacitance of a stacked capacitor at a sufficient level and in which a storage electrode contact can be formed in a self-alignment form with respect to a gate electrode, so that the planar surface area of the memory cell can be reduced.

According to one aspect of the invention, there is provided a semiconductor memory device having a stacked capacitor cell, the memory device comprises:

a semiconductor substrate;

a field oxide film and a gate oxide film which are formed on the semiconductor substrate;

a gate electrode which is formed on each of the field oxide film and the gate oxide film;

impurity diffusion layers which are formed in the semiconductor substrate and which, together with the gate electrode, form a MOS transistor;

an insulation layer which partly covers the MOS transistor and has a window;

a storage electrode with a storage electrode contact is in contact with the window, the storage electrode having, as a part thereof, a first electroconductive film which surrounds the window circumferentially and, as another part thereof, a second electroconductive film which is in contact with the first electroconductive film at least on its inside portion and also with the window;

an insulation film which is formed on an upper surface of the gate electrode; and a side wall of an oxide film which is formed on each of side portions of the gate electrode and the insulation film;

wherein the storage electrode contact is self-aligned with respect to the gate electrode.

According to another aspect of the invention, there is also provided a semiconductor memory device having a stacked capacitor cell, the memory device comprises:

a semiconductor substrate;

a field oxide film and a gate oxide film which are formed on the semiconductor substrate;

a gate electrode which is formed on each of the field oxide film and the gate oxide film;

impurity diffusion layers which are formed in the semiconductor substrate and which, together with the gate electrode, form a MOS transistor;

an insulation layer which partly covers the MOS transistor and has a window;

a storage electrode with a storage electrode contact is in contact with the window, the storage electrode having, as a part thereof, a first electroconductive film which surrounds the window circumferentially and, as another part thereof, a second electroconductive film which is in contact with the first electroconductive film at least on its inside portion and also with the window; and a side wall of an oxide film which is in contact with the window receiving the storage electrode, with each of side portions of the gate electrode and with an inner periphery of the first electroconductive film surrounding the window circumferentially and forming the part of the storage electrode;

wherein the storage electrode contact is self-aligned with respect to the gate electrode.

The semiconductor memory device structured as above makes it possible for the storage electrode contact to be formed in a self alignment form with respect to the gate electrode, which means that the space between the storage electrode contact and the gate electrode can be made zero (0), thus a planar surface area of a memory cell can be made small.

BRIEF DESCRIPTION OF THE DRAWINGS

The above and other objects, features and advantages of the present invention will be apparent from the following description of preferred embodiments of the invention, with reference to the accompanying drawings, in which.

PREFERRED EMBODIMENTS OF THE INVENTION

Now, preferred embodiments of the present invention will be explained with reference to the accompanying drawings.

Figure 2:
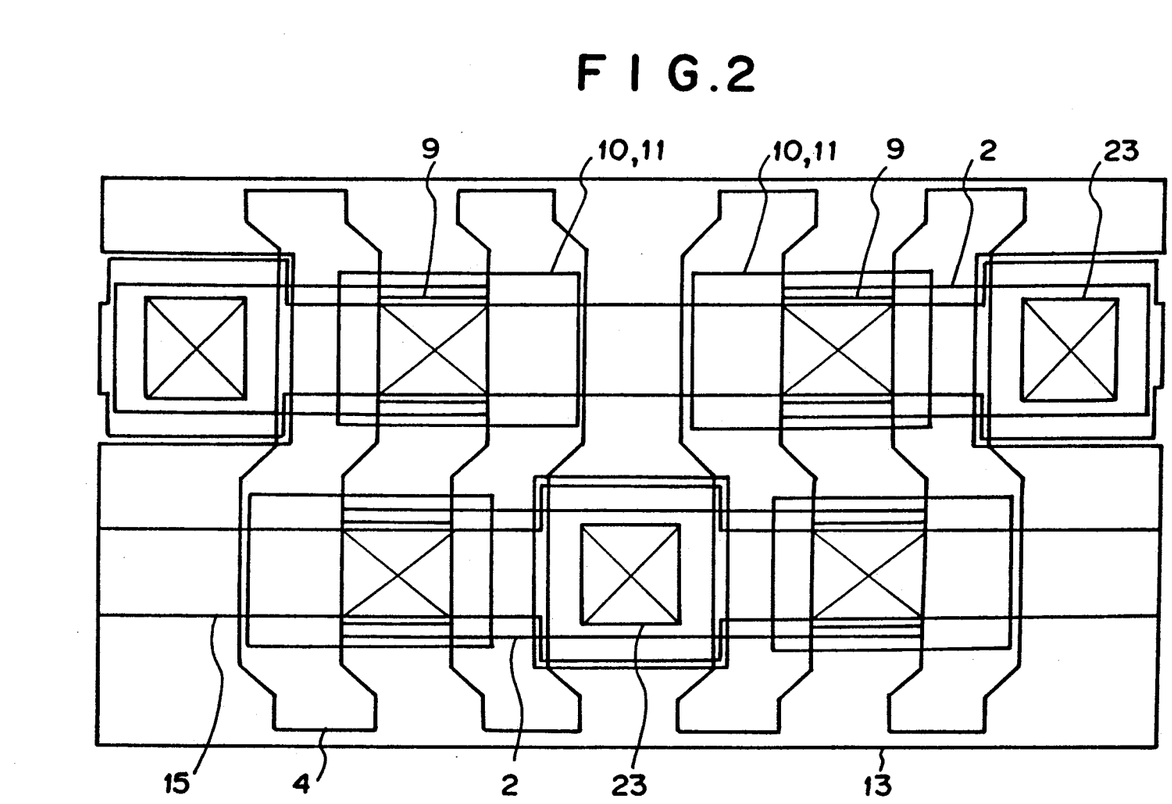
FIG. 2 is a top plan view of a semiconductor memory device of a first embodiment according to the invention.
Figure 3:
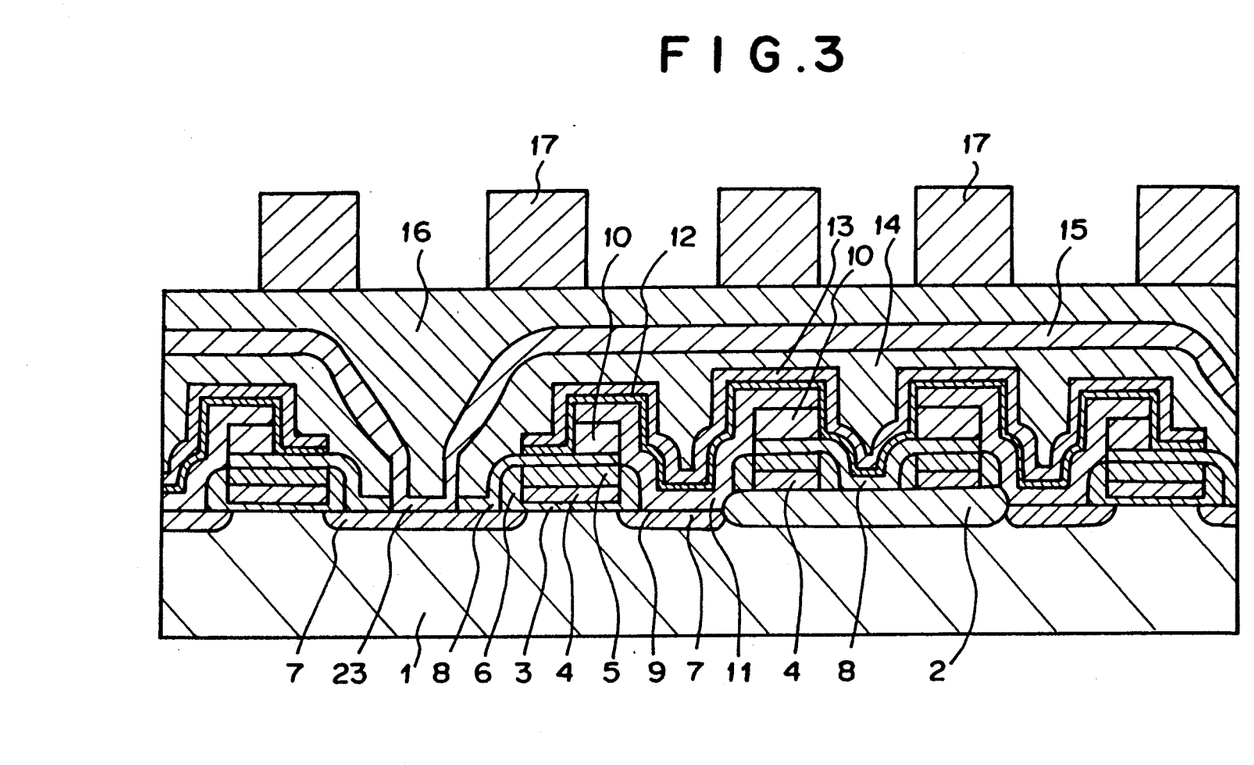
FIG. 3 is a cross-sectional view of the device shown in FIG. 2.

FIG. 2 is a top plan view showing a main part of a semiconductor memory device according to a first embodiment of this invention, in which an area space between a storage electrode contact 9 and a gate electrode 4 is made zero (0) $\mu$m in order that a memory cell has the planar surface area made below 5 $\mu$m². FIG. 3 is a cross-sectional view of the device shown in FIG. 2, which includes a semiconductor substrate 1, a field oxide film 2, a gate oxide film 3, gate electrodes 4, an insulation layer 5 which keeps a sufficient electrical insulation with respect to the gate electrode 4 when the storage electrode contact 9 is opened, a side-wall 6 which is made of an oxide film, an impurity diffusion layer 7, an interlayer insulation film 8, a first electroconductive film 10 which constitutes one part of a capacity storage electrode, a second electroconductive film 11 which constitutes one part of the capacity storage electrode, a capacity insulation film 12, a capacity opposed electrode 13, interlayer insulation films 14 and 16, a bit line 15 which is made of a high melting-point metal silicide, and an aluminum wiring 17.

FIG. 4(a) through FIG. 4(i) cross-sectionally show, in a step order, a process for fabricating the semiconductor memory device of the first embodiment shown in FIGS. 2 and 3.

Figure 4A:
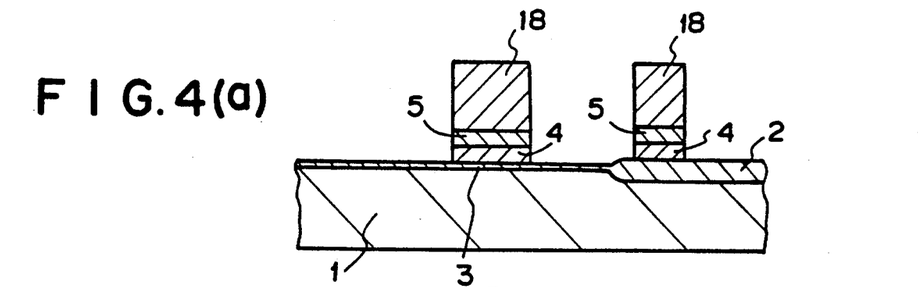
FIGS. 4(a) to 4(i) are cross-sectional views showing, in a step order, a process for fabricating the device shown in FIG. 3.

First, as shown in FIG. 4(a), using a selective oxidation method, the field oxide film 2 and then the gate oxide film 3 are formed on predetermined surface areas of the semiconductor substrate 1. Then, the gate electrode 4 made of polysilicon is formed on each of the field oxide film 2 and the gate oxide film 3 at its predetermined position, and the insulation film 5 made of an oxide film, is formed to have a thickness within a range of 0.1 $\mu$m to 0.5 $\mu$m for example, 0.2 $\mu$m. Thereafter, both the insulation film 5 and the gate electrode 4 are etched by, for example, a reactive-ion etching (RIE) method with a photoresist 18 being used as a mask.

Figure 4B:
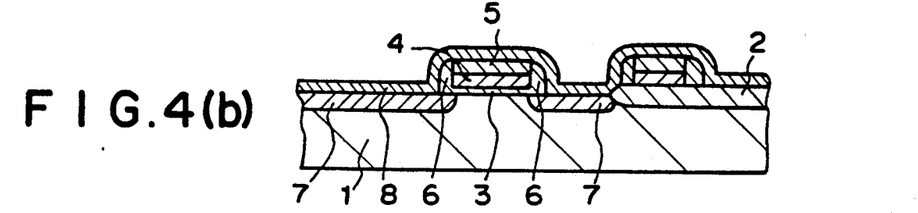

Next, as shown in FIG. 4(b), the side-wall 6 made of an oxide film having a thickness of, for example, 0.2 $\mu$m is formed on the side surface of the gate electrode 4. Then, the interlayer insulation film 8 having a thickness of 0.2 $\mu$m is formed on the resultant upper surface of the device.

Figure 4C:
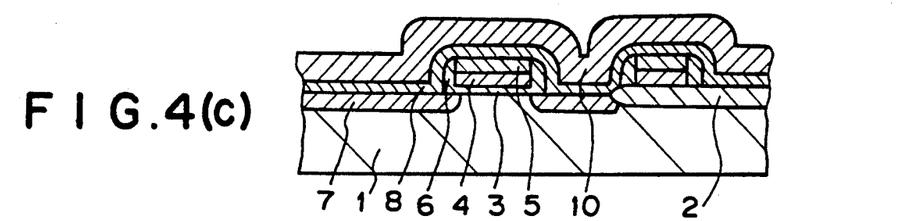
Figure 4D:
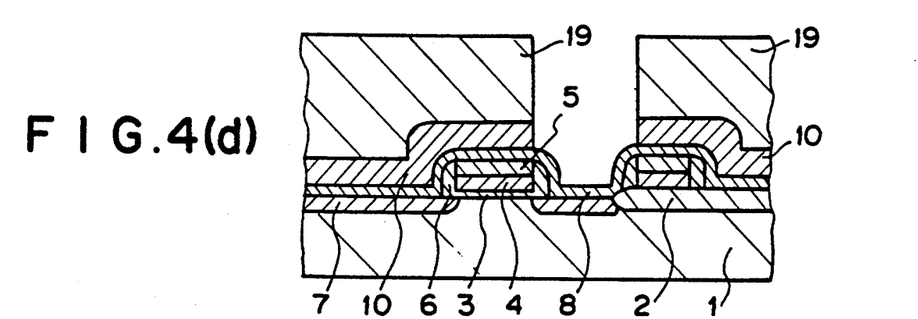
Figure 4E:
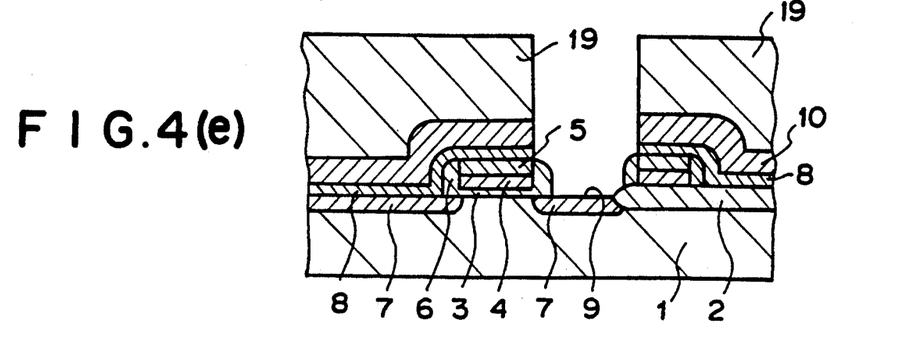

Next, as shown in FIG. 4(c), a polysilicon film 10 is formed on the interlayer insulation film 8 up to a thickness of, for example, 0.3 $\mu$m to obtain the first electroconductive film 10 constituting one part of the capacity storage electrode. Thereafter, as shown in FIG. 4(d), the polysilicon film 10 thus formed is selectively removed by the RIE method with a photoresist 19 being used as a mask. Then, as shown in FIG. 4(e), the interlayer insulation film 8 is selectively etched with the same mask as above being used, so that the surface of the semiconductor substrate 1, that is, the surface of the impurity diffusion layer 7 is exposed, thereby forming a storage electrode contact 9. Here, it should be noted that the edge of the storage electrode contact 9 Is in alignment with respect to the edge of the gate electrode 4, which means that the storage electrode contact 9 is so-called a self-align contact with the gate electrode 4. In this case, even if the selective etching of the interlayer insulation film 8 is made somewhat excessively (for example, in the order of 40%–50%), the electrical insulation between the storage electrode contact 9 and the gate electrode 4 can be maintained well if the sidewall 6 of an oxide film and the insulation film 5 of, for example, an oxide film are formed sufficiently thick for the maintenance of the electric insulation.

Figure 4F:
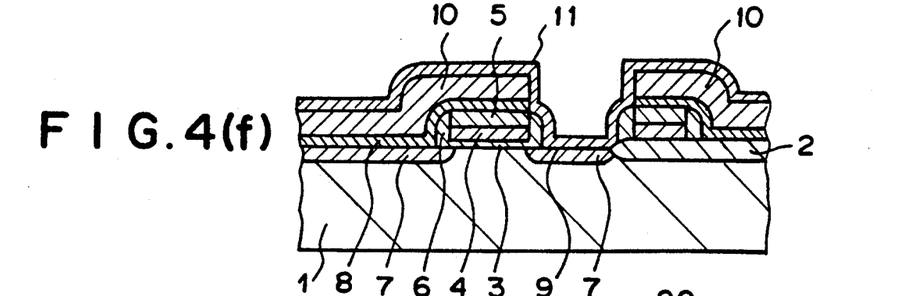
Figure 4G:
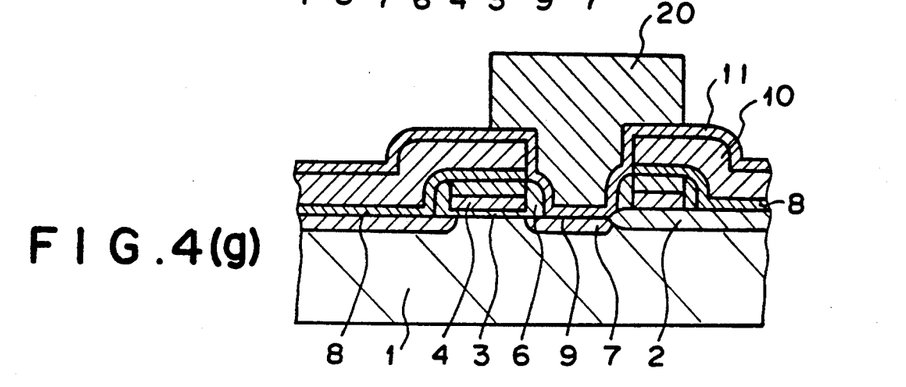
Figure 4H:
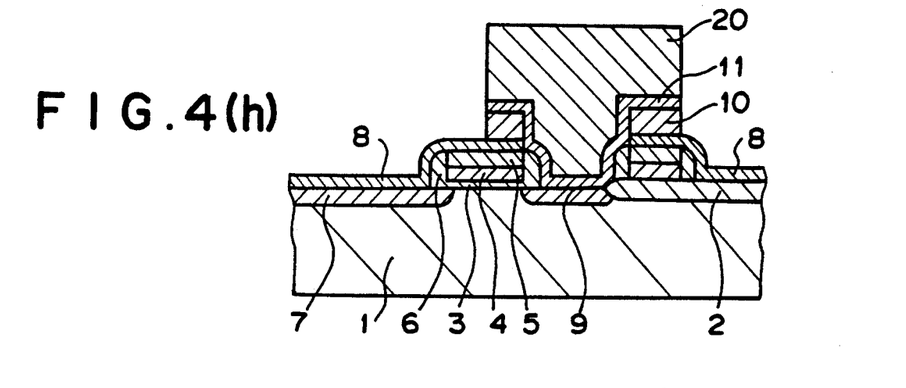
Figure 4I:
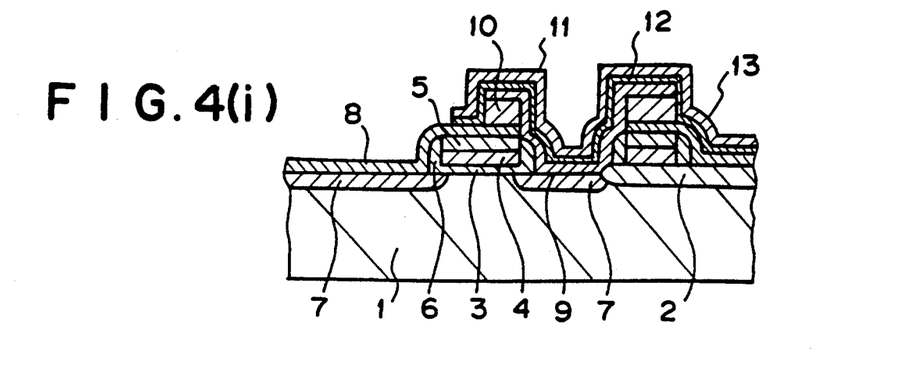

Next, as shown in FIG. 4(f), a polysilicon film 11 is formed up to a thickness of, for example, 0.15 $\mu$m to obtain the second electroconductive film 11 constituting one part of the capacity storage electrode. Then, as shown in FIGS. 4(g) and 4(h), both the polysilicon films 10 and 11 thus formed as above are selectively etched using a photoresist 20 as a mask thereby to form the first and second electroconductive films 10 and 11 each constituting one part of the capacity storage electrode. Then, as shown in FIG. 4(i), the capacity opposed electrode 13 made of a polysilicon is formed thereon. Thereafter, the interlayer insulation films 14 and 16, the bit line 15 and the aluminum wiring 17 are formed thereon in a successive manner, thus completing the semiconductor memory device as cross-sectionally shown in FIG. 3.

FIG. 5(a) through FIG. 5(h) cross-sectionally show, in a step order, a process for fabricating a semiconductor memory device of a second embodiment according to the invention.

Figure 5A:
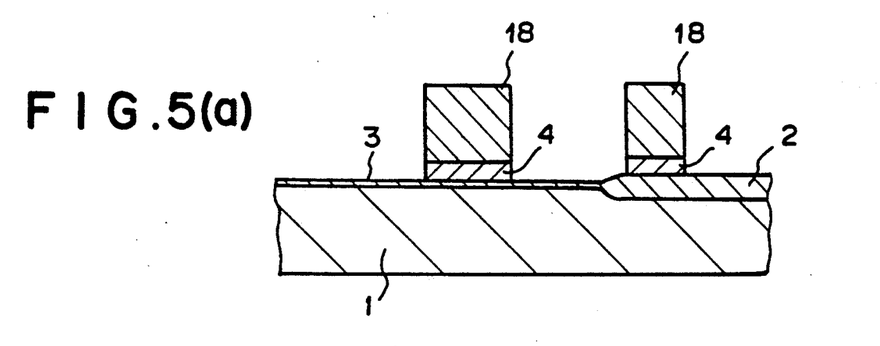
FIGS. 5(a) to 5(h) are cross-sectional view showing, in a step order, a process for fabricating a semiconductor memory device of another embodiment according to the invention.

First, as in the first embodiment, by the selective oxidation method, the field oxide film 2 and the gate oxide film 3 are formed in the respective predetermined areas of the semiconductor substrate 1, and thereafter the gate electrode 4 made of polysilicon is formed on each of the field oxide film 2 and the gate oxide film 3. Next, as shown in FIG. 5(a), the gate electrode 4 is etched by the RIE method with a photoresist 18 being used as a mask.

Figure 5B:
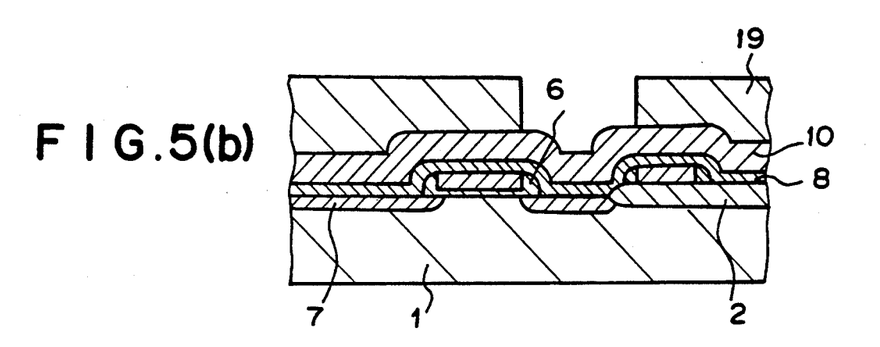
Figure 5C:
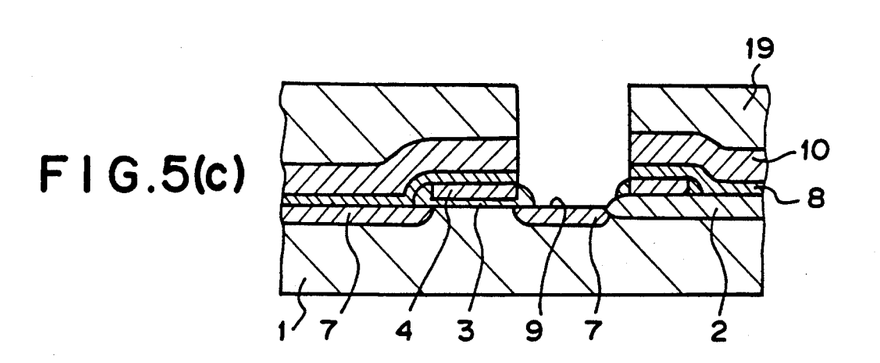

Next, as shown in FIG. 5(b), the side-wall 6 of an oxide film is formed on the side surface of the gate electrode 4 up to a thickness of, for example, 0.2 $\mu$m, and the interlayer insulation film 8 is formed up to a thickness of, for example, 0.2 $\mu$m. Next, the polysilicon film 10 for obtaining the first electroconductive film constituting one part of the capacity storage electrode is formed thereon up to a thickness of, for example, 0.3 $\mu$m. Thereafter, as shown in FIG. 5(c), the polysilicon film 10 is selectively removed by the reactive-ion etching (RIE) method with the photoresist 19 being used as a mask. Then, the interlayer insulation film 8 is selectively etched by using the same mask as above, so that the surface of the semiconductor substrate 1, that is, the surface of the impurity diffusion layer 7 is exposed, thereby forming the storage electrode contact 9.

Figure 5D:
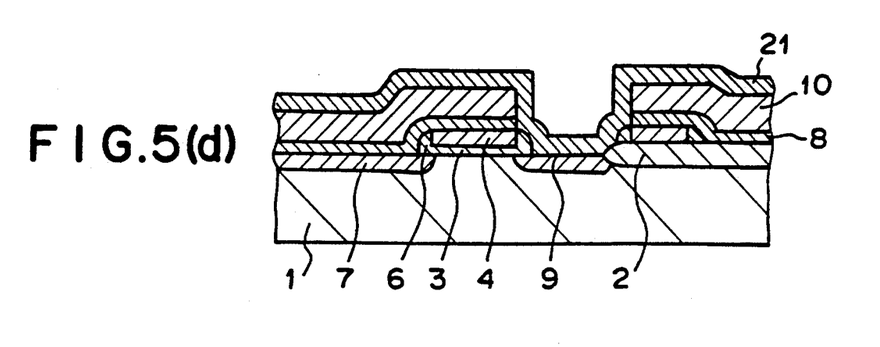
Figure 5E:
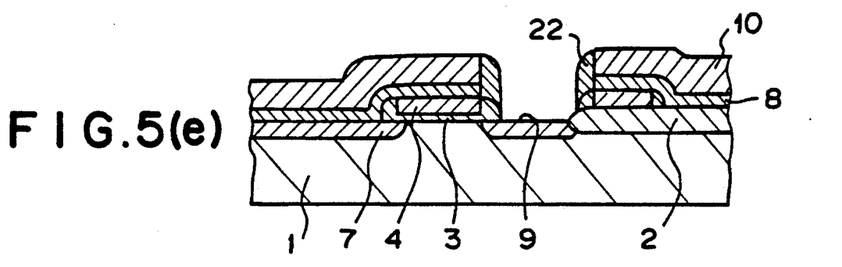

Next, as shown in FIG. 5(d), an insulation film 21 made of an oxide film is formed up to a thickness of, for example, 0.2 μm by, for example, a low pressure chemical vapor deposition (LPCVD) method and, thereafter, it is etch-backed by the reactive-ion etching (RIE) method to form a side-wall 22 of an oxide film as shown in FIG. 5(e). It should be noted that the electric insulation characteristics between the storage electrode contact 9 and the gate electrode 4 can be maintained well by the side-wall 22 thus formed.

Figure 5F:
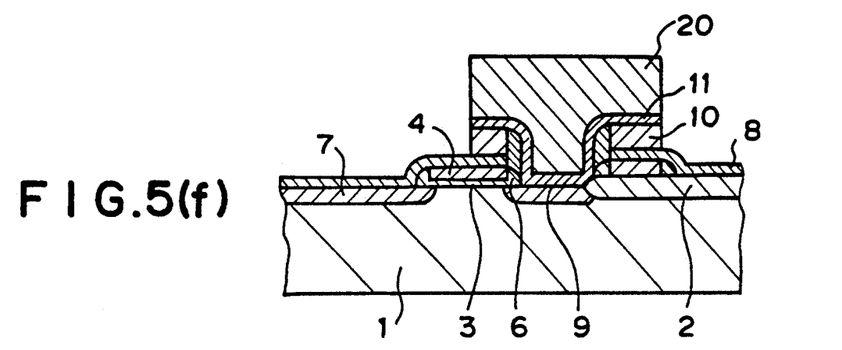
Figure 5G:
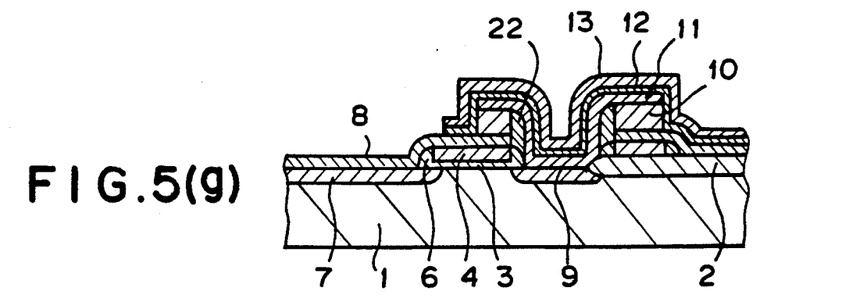
Figure 5H:
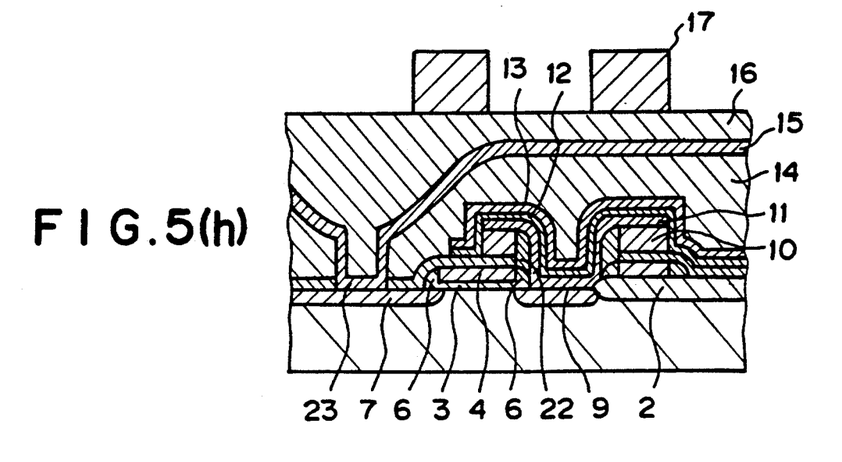

Next, as shown in FIG. 5(f), a polysilicon film 11 is formed up to a thickness of, for example, 0.15 μm to obtain the second electroconductive film 11 constituting one part of the capacity storage electrode and, thereafter, both the polysilicon film 10 and the polysilicon film 11 are selectively etched with a photoresist 20 being used as a mask, thereby to form the capacity storage electrode. As in the first embodiment, the capacity opposed electrode 13 made of polysilicon is formed as shown in FIG. 5(g), and then, the interlayer insulation films 14 and 16, the bit line 15 and the aluminum wiring 17 are formed thereon, thus completing the semiconductor memory device as shown in FIG. 5(h).

As explained above, the semiconductor memory device according to this invention is characterized in that in order to allow the storage electrode contact 9 to be formed in a self-alignment with the gate electrode 4, in the first aspect, the insulation film 5 having a thickness of, for example, 0.2 μm and the side-wall 6 of an oxide film having a thickness of, for example, 0.2 μm are provided on the upper surface and the side surface of the gate electrode 4, respectively, and in the second aspect, after opening the storage electrode contact 9, the side-wall 22 of an oxide film having a thickness of, for example, 0.2 μm is provided on the side surface of the gate electrode 4. Accordingly, the space in terms of an area between the storage electrode contact 9 and the gate electrode 4 can be made 0 μm, and the planar surface area of the memory cell can be reduced to about 5 μm² or less.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor memory device having a stacked capacitor cell, comprising:
    a semiconductor substrate;
    a field oxide film and a gate oxide film which are formed on said semiconductor substrate;
    a gate electrode which is formed on each of said field oxide and said gate oxide film;
    impurity diffusion layers which are formed in said semiconductor substrate and which, together with said gate electrode, for a MOS transistor;
    an insulation layer which partly covers said MOS transistor and has a window;
    a storage electrode with a storage electrode contact is in contact with window, said storage electrode having, as a part thereof, a first electroconductive film which surrounds said window circumferentially and, as another part thereof, a second electroconductive film which is in contact with said first electroconductive film at least on its inside portion and also with said window; and
    a side wall of an oxide film which Is in contact with said window receiving said storage electrode, with each of side portions of said gate electrode and with an inner periphery of said first electroconductive film surrounding said window circumferentially and forming the part of said storage electrode,
    wherein said storage electrode contact is self-aligned with respect to said gate electrode.

2. A semiconductor memory device having a stacked capacitor cell according to claim 1, wherein said insulation layer has a thickness of about 0.2 μm.

3. A semiconductor memory device having a stacked capacitor cell according to claim 1, wherein said side wall covers at least one said side portion of said gate electrode and a side of said first electroconductor film.

4. A semiconductor memory device having a stacked capacitor cell according to claim 2, wherein said side wall covers at least one said side portion of said gate electrode and a side of said first electroconductor film.

* * * * *

UNITED STATES PATENT AND TRADEMARK OFFICE
CERTIFICATE OF CORRECTION

PATENT NO. : 5,305,256
DATED : APRIL 19, 1994
INVENTOR(S) : TANIGAWA

It is certified that error appears in the above-identified patent and that said Letters Patent is hereby corrected as shown below:

Title Page:

IN THE ABSTRACT:

Line 9, delete "Is" insert --is--

Signed and Sealed this

Thirtieth Day of August, 1994

Attest:

BRUCE LEHMAN

Attesting Officer

Commissioner of Patents and Trademarks